United States Patent [19]

Nakamura

[11] Patent Number: 4,899,065
[45] Date of Patent: Feb. 6, 1990

[54] PRE-DRIVE CIRCUIT

[75] Inventor: Shigeo Nakamura, Minamitsuru, Japan

[73] Assignee: Fanuc Ltd, Minamitsuru, Japan

[21] Appl. No.: 265,677

[22] PCT Filed: Apr. 25, 1988

[86] PCT No.: PCT/JP88/00403
§ 371 Date: Oct. 31, 1988
§ 102(e) Date: Oct. 31, 1988

[87] PCT Pub. No.: WO88/08643
PCT Pub. Date: Nov. 3, 1988

[30] Foreign Application Priority Data

Apr. 30, 1987 [JP] Japan ................. 62-107253

[51] Int. Cl.$^4$ .................... H03K 17/00; H03K 3/30
[52] U.S. Cl. .................... 307/270; 307/282; 307/570; 307/571
[58] Field of Search ............. 307/282, 570, 571, 270

[56] References Cited

U.S. PATENT DOCUMENTS

| 3,657,569 | 4/1972 | Froeschle | 307/275 |
| 3,666,971 | 5/1972 | Bixby et al. | 307/282 |
| 3,819,956 | 6/1974 | Hughes et al. | 307/282 |
| 4,423,341 | 12/1983 | Shelly | 307/570 |
| 4,461,966 | 7/1984 | Hebenstreit | 307/571 |

FOREIGN PATENT DOCUMENTS

| 0018374 | 2/1978 | Japan | 307/270 |
| 0100020 | 5/1986 | Japan | 307/570 |

Primary Examiner—Stanley D. Miller
Assistant Examiner—Nancy Thai
Attorney, Agent, or Firm—Staas & Halsey

[57] ABSTRACT

A pre-drive circuit performs on/off control of a switching transistor element ($Q_1$) through a pulse transformer (T) having two primary windings ($P_1$, $P_2$). Switching elements ($Q_2$, $Q_3$) are respectively connected to the primary windings. Feedback circuits ($D_1$, $D_2$) connect signal output terminals of the respective switching elements ($Q_2$, $Q_3$) to control terminals of the opposite switching elements ($Q_3$, $Q_2$).

7 Claims, 2 Drawing Sheets

FIG. 1
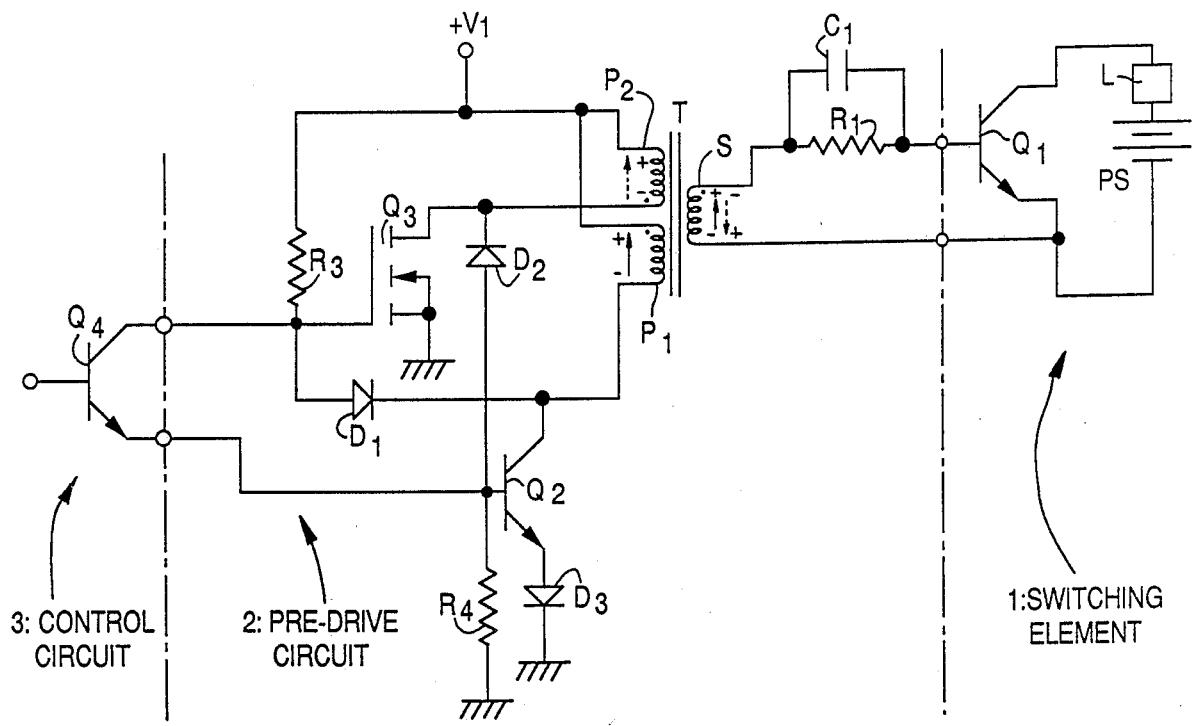
3: CONTROL CIRCUIT
2: PRE-DRIVE CIRCUIT
1: SWITCHING ELEMENT
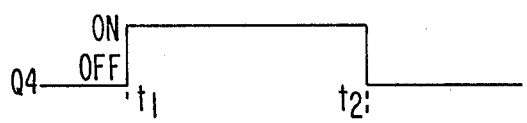
FIG. 2(a) Q4
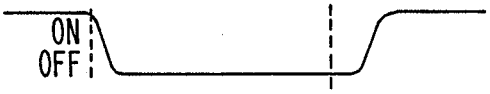
FIG. 2(b) Q3
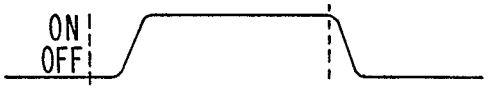
FIG. 2(c) Q2
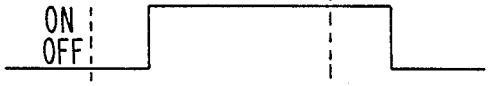
FIG. 2(d) Q1

3: CONTROL CIRCUIT
2: PRE-DRIVE CIRCUIT
1: SWITCHING ELEMENT

PRE-DRIVE CIRCUIT

BACKGROUND OF THE INVENTION

1. Field of the Invention

This invention relates to a pre-drive circuit for use in a switching regulator, a DC/DC converter, etc.

2. Description of the Related Art

A pre-drive circuit which performs the on-off control of a switching transistor element through a pulse transformer is one which on/off controls the power transistor of a switching circuit by the use of two drive transistors, as illustrated in FIG. 4.

With reference to FIG. 4, a switching circuit 1 on/off controls a power source PS for a load L by means of a power transistor $Q_1$ and is connected to a control circuit 3 through a pre-drive circuit 2. Connected across the base and emitter of the power transistor $Q_1$, through a parallel circuit consisting of a resistor $R_1$ and a capacitor C, is a secondary coil S of a pulse transformer T. On the primary side of the pulse transformer T, a transistor $Q_2$ is connected to a first primary coil $P_1$, and a transistor $Q_3$ is connected to a second primary coil $P_2$.

In turning on the power transistor $Q_1$, a signal output transistor $Q_5$ of the control circuit 3 is turned off to turn on the transistor $Q_2$. When the transistor $Q_2$ is turned on, voltages in polarities indicated by solid lines in the figure are generated in the pulse transformer T, and current flows to the base of the power transistor $Q_1$ to bring this power transistor $Q_1$ to the on state.

In turning off the power transistor $Q_1$, the signal output transistor $Q_5$ is turned on which turns off the transistor $Q_2$, while at the same time, a signal output transistor $Q_4$ is turned off to turn on the transistor $Q_3$. The base charge of the power transistor $Q_1$ is extracted by voltages in polarities indicated by the broken lines in the FIGURE, thereby turning on this power transistor $Q_1$.

With such a prior art pre-drive circuit, the transistor $Q_2$ is turned off and the transistor $Q_3$ is simultaneously turned on in order to turn off the power transistor $Q_1$. In this regard, the conventional transistors involve a delay in terms of the response of collector current to base current, and when control signals SA and SB to be applied to the pre-drive circuit 2 are provided with exactly opposite phases, the transistors $Q_2$ and $Q_3$ are turned on simultaneously. At this moment, excess currents flow through both the transistors $Q_2$ and $Q_3$, resulting in the useless generation of heat. This makes it necessary to delay slightly the time at which the transistor $Q_3$ turns on.

Moreover, the prior art involves problems in terms of the current efficiency and circuit arrangement thereof. That is, the control circuit 3 requires the two signal output transistors $Q_4$ and $Q_5$ in order to supply the respective transistors $Q_2$ and $Q_3$ with the control signals SA and SB.

SUMMARY OF THE INVENTION

The present invention has been divised in order to solve the foregoing problems, and its object is to provide a pre-drive circuit in which feedback circuits are cross-connected to transistors serving as switching elements, wherein after one of the transistors is turned off, the other transistor is turned on, thereby simplifying the arrangement of a control circuit and preventing the useless generation of heat.

According to the present invention, it is possible to provide a pre-drive circuit wherein the on/off control of a switching transistor element is performed through a pulse transformer having two primary windings to which switching elements are respectively connected, the pre-drive circuit comprising feedback circuits which cross-connect the signal output terminals of the respective switching elements and the control terminals of the opposite switching transistors.

With the pre-drive circuit of the present invention, a corresponding one of the feedback circuits is connected from the signal output terminal of one switching element to the control element of the other switching element, whereby after one switching element has completely turned off, the other switching element turns on. Accordingly, excess currents can be prevented from developing in the pre-drive circuit and the arrangement of the control circuit can be simplified.

BRIEF DESCRIPTION OF THE DRAWINGS

FIG. 1 is a circuit diagram of a pre-drive circuit and its peripheral circuits showing an embodiment of the present invention;

FIG. 2 is a chart showing the operation timing of the circuit of the embodiment illustrated in FIG. 1;

DESCRIPTION OF THE PREFERRED EMBODIMENTS

Figure 3:
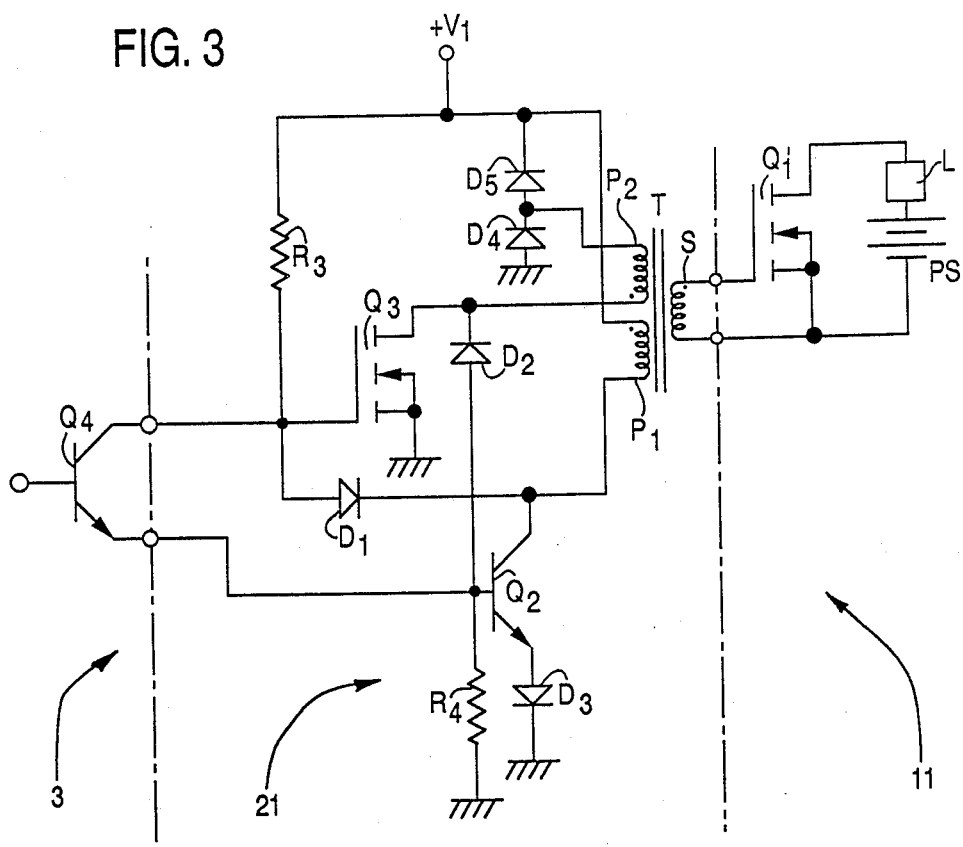
FIG. 3 is a circuit diagram showing another embodiment of the present invention.
Figure 4:
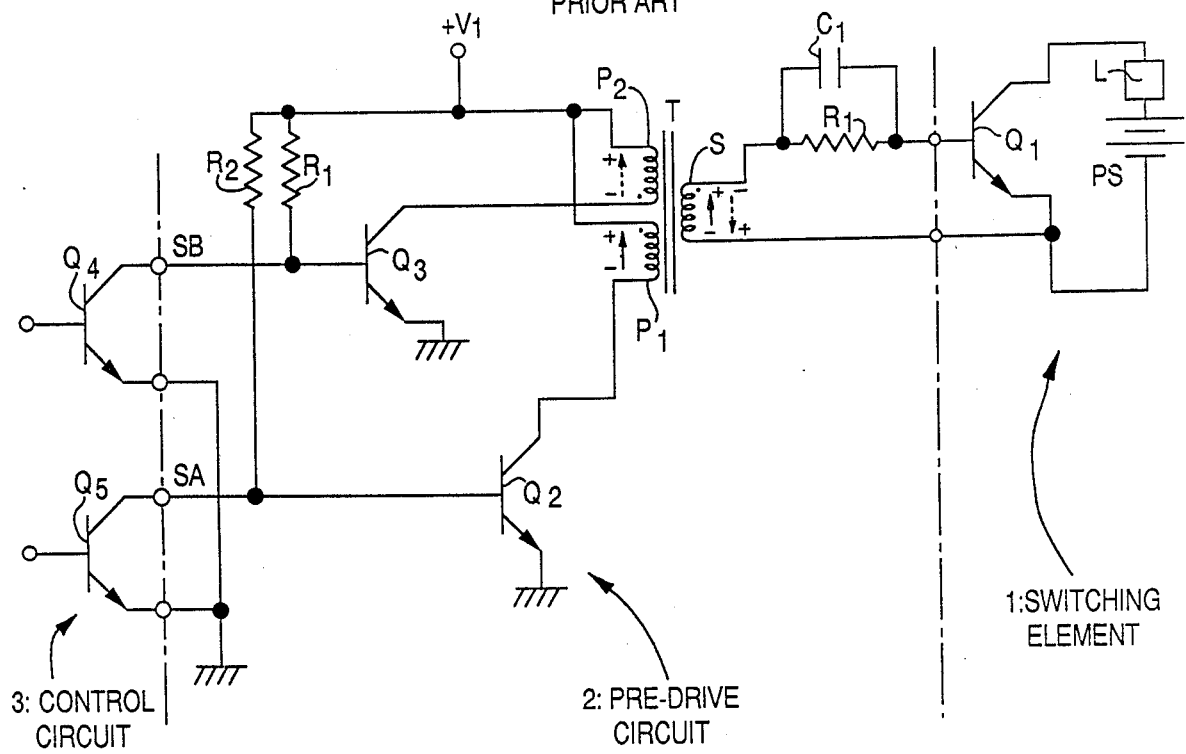
FIG. 4 is a circuit diagram showing an example of a prior-art circuit arrangement.

An embodiment of the present invention will now be described in detail with reference to the drawings.

FIG. 1 shows a pre-drive circuit illustrative of a first embodiment of the present invention. Although shown in a simplified form in the figure, a switching circuit 1 to be driven by a pre-drive circuit 2 includes a power transistor $Q_1$, etc. This power transistor $Q_1$ is turned on and off by current which is supplied from a pulse transformer T.

The emitter of the power transistor $Q_1$ is connected to the minus side of the power source PS of the switching circuit 1 and is also connected to one end of the secondary coil S of the pulse transformer T. The other end of the secondary coil S is connected to the base of the transistor $Q_1$ through a parallel circuit consisting of a resistor $R_1$ and a capacitor $C_1$.

On the primary side of the pulse transformer T, two primary coils $P_1$ and $P_2$ are arranged in opposite phases to each other. The collector of a conventional bipolar transistor $Q_2$ is connected to the first primary coil $P_1$, while the drain of a MOS-type FET $Q_3$, which functions as the second switching element, is connected to the second primary coil $P_2$. In addition, a diode $D_1$, which functions as a feedback circuit, is connected in the reverse direction from the collector terminal of the transistor $Q_2$ to the gate terminal of the FET $Q_3$, while a diode $D_2$, which functions as a feedback circuit, is connected in the reverse direction from the drain terminal of the FET $Q_3$ to the base terminal of the transistor $Q_2$. Further, a diode $D_3$ is connected in the forward direction between the emitter of the transistor $Q_2$ and ground, whereby the potential difference of the transistor $Q_2$ relative to ground is raised by an amount corresponding to the forward potential difference across the diode $D_3$. Meanwhile, a control circuit 3, which delivers control signals to the pre-drive circuit 2, has a signal output transistor $Q_4$, the emitter and collector of which are respectively connected to the base of the transistor $Q_2$ and the gate of the FET $Q_3$. Thus, the control circuit applies a predetermined voltage from a voltage source $V_1$ through a resistor $R_3$ to a node between the collector of the transistor $Q_4$ and the gate of the FET $Q_3$, to determine the base current of the transistor $Q_2$ when the transistor $Q_4$ is on, and supplies a sufficient voltage to the gate of the FET $Q_3$ when the transistor $Q_4$ is off, to turn on this FET $Q_3$.

FIG. 2 exemplifies on and off operation timing in the circuit of the first embodiment. FIG. 2(a) shows the relative state of the signal output transistor $Q_4$ of the control circuit 3, (b) the relative state of the FET $Q_3$, (c) the state of the relative transistor $Q_2$, and (d) the relative state of the power transistor $Q_1$.

When the transistor $Q_4$ is turned on with the intention of turning on the power transistor $Q_1$, currents attempt to flow from the resistor $R_3$ and the gate of the FET $Q_3$ through the transistor $Q_4$ to the base of the transistor $Q_2$. However, since current flows to the drain of the FET $Q_3$ through the diode $D_2$ while the FET $Q_3$ is on, the transistor $Q_2$ does not turn on. When the FET $Q_3$ turns off owing to the extinction of the gate charges thereof, the current through the diode $D_2$ fails to flow, and the current flows to the base of the transistor $Q_2$ instead, so that this transistor $Q_2$ turns on. Thus, voltages in polarities indicated by the solid lines in FIG. 1 are generated in the pulse transformer T, and the power transistor $Q_1$ is turned on.

On the other hand, when the transistor $Q_4$ is turned off with the intention of turning off the power transistor $Q_1$, the transistor $Q_2$ has its base current cut off and turns off after elapse of a period of time required for the extinction of the charges of the base thereof. During the time that the transistor $Q_2$ is on, current from the resistor $R_3$ flows to the collector of the transistor $Q_2$ through the diode $D_1$, and the gate voltage of the FET $Q_3$ remains low in spite of the off state of the transistor $Q_4$; hence, the FET $Q_3$ does not turn on. When the transistor $Q_2$ turns off to raise the collector voltage thereof, the FET $Q_3$ has its gate voltage increase and turns on. Thus, voltages in polarities indicated by the broken lines in the figure are generated in the pulse transformer T, and the power transistor $Q_1$ is turned off.

FIG. 3 is a circuit diagram showing another embodiment of the present invention. In this embodiment, a power transistor $Q_1'$ of a switching circuit 11 to be controlled by a pre-drive circuit 21 is a MOSFET, and the circuit arrangement of a FET $Q_3$ connected to the secondary primary coil $P_2$ differs from that in the case of FIG. 1.

Operation at the time the power transistor $Q_1'$ attempts to turn on is the same as in the case of FIG. 1. Further, regarding operation at the time the power transistor $Q_1'$ attempts to turn off, operation until the FET $Q_3$ turns on is the same as in the case of FIG. 2. When the FET $Q_3$ turns on, both ends of the secondary coil S are equivalently short-circuited, so that the voltage at the gate of the power transistor $Q_1'$ connected to the secondary coil S becomes about zero, turning off the power transistor $Q_1'$.

In the pre-drive circuit illustrated in each of the embodiments, the gate voltage required to turn on the FET $Q_3$ is usually 2 V or above. Hence, the emitter and collector of the single signal output transistor $Q_4$ are respectively connected to the transistor $Q_2$ and the FET $Q_3$, whereby the transistor $Q_2$ and the FET $Q_3$ can be prevented from being turned on simultaneously by the transistor $Q_4$. This prevents the useless generation of heat in the pulse transformer T and the transistor $Q_2$ as well as the FET $Q_3$.

Though two embodiments of the present invention have been described, the invention is not limited thereto and can be modified in a variety of ways without departing from the scope of the claims.

When used in a switching regulator, a DC/DC converter or the like, the pre-drive circuit of the present invention can improve the current efficiency and circuit arrangement thereof.

I claim:

1. A pre-drive circuit, for on/off control of a switching transistor element, including a pulse transformer having two primary windings, comprising:
   first and second switching elements, each having a signal output terminal and a control terminal, and one being associated with each of the primary windings, which control currents flowing through the respective primary windings; and
   feedback circuits which cross-connect the signal output terminals and the control terminals of said first and second switching elements.

2. A pre-drive circuit according to claim 1, wherein each of said feedback circuits is constructed of a diode which is connected in a forward direction with respect to a corresponding control signal, and in that after one of the said first and second switching elements has turned off, the other is turned on.

3. A pre-drive circuit according to claim 1, wherein a bipolar transistor is employed as one of said first and second switching elements, and an insulated-gate field-effect transistor is employed as the other.

4. A pre-drive circuit for controlling switching of a transistor element, comprising:
   means, having first and second primary windings and a secondary winding, for performing on/off switching of the transistor element;
   first and second switching means, each having a control terminal and a signal output terminal, for controlling the currents flowing through the first and second primary windings, respectively; and
   feedback means for cross-connecting the control terminal of each of said first and second switching means to the signal output terminal of said first and second switching means.

5. A pre-drive circuit according to claim 4, wherein said feedback means comprise first and second circuits, each having a diode, such that after one of said first and second switching means is turned off, the other is turned on.

6. A pre-drive circuit according to claim 4, wherein said first switching means comprises a bipolar transistor and said second switching means comprises an insulated-gate field effect transistor.

7. A pre-drive circuit according to claim 5, wherein said first and second primary windings having opposite phases, so that when said first primary winding is turned on by turning on said first switching means, the transistor element is turned on, and when said second primary winding is turned on by turning on said second switching means, the transistor element is turned off.

* * * * *